United States Patent
Ichimiya

(10) Patent No.: US 7,426,707 B2
(45) Date of Patent: *Sep. 16, 2008

(54) LAYOUT DESIGN METHOD FOR SEMICONDUCTOR INTEGRATED CIRCUIT, AND SEMICONDUCTOR INTEGRATED CIRCUIT

(75) Inventor: Junji Ichimiya, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 151 days.

This patent is subject to a terminal disclaimer.

(21) Appl. No.: 11/440,633

(22) Filed: May 24, 2006

(65) Prior Publication Data
US 2006/0218519 A1 Sep. 28, 2006

Related U.S. Application Data

(63) Continuation of application No. 10/701,249, filed on Nov. 4, 2003, now Pat. No. 7,076,756.

(30) Foreign Application Priority Data
Nov. 5, 2002 (JP) .............................. 2002-320912

(51) Int. Cl.
*G06F 17/50* (2006.01)
(52) U.S. Cl. ............................... 716/10; 716/9; 716/18
(58) Field of Classification Search ............. 716/9, 716/10, 18
See application file for complete search history.

(56) References Cited

U.S. PATENT DOCUMENTS

| | | | | |
|---|---|---|---|---|
| 4,931,946 A * | 6/1990 | Ravindra et al. | ............... | 716/16 |
| 5,157,618 A * | 10/1992 | Ravindra et al. | ............... | 716/16 |
| 6,505,335 B1 * | 1/2003 | Tanaka | ............... | 716/13 |
| 6,618,847 B1 * | 9/2003 | Hulse et al. | ............... | 716/8 |
| 6,751,785 B1 * | 6/2004 | Oh | ............... | 716/10 |
| 6,797,999 B2 * | 9/2004 | Hou et al. | ............... | 257/211 |
| 6,904,581 B1 * | 6/2005 | Oh | ............... | 716/10 |
| 7,076,756 B2 * | 7/2006 | Ichimiya | ............... | 716/10 |
| 2001/0015464 A1 * | 8/2001 | Tamaki | ............... | 257/393 |
| 2002/0013931 A1 * | 1/2002 | Cano et al. | ............... | 716/1 |
| 2002/0029371 A1 * | 3/2002 | Hwang et al. | ............... | 716/10 |

(Continued)

FOREIGN PATENT DOCUMENTS

JP 09199601 7/1997

(Continued)

OTHER PUBLICATIONS

U.S. Appl. No. 09/951,071, to Ichimiya et al., filed Sep. 13, 2001.

*Primary Examiner*—Phallaka Kik
(74) *Attorney, Agent, or Firm*—Cooper & Dunham LLP

(57) ABSTRACT

In a layout design method for a semiconductor integrated circuit, a cell layout library is provided which stores structure information of functional cells and a plurality of groups of filler cells, each filler cell acting to fill space between the functional cells. The functional cells are arranged on a layout based on the structural information from the layout library. The filler cells of any of the plurality of groups are arranged selectively based on the structural information from the layout library so that the filler cells are arranged in channel regions where the functional cells are not located on the layout, each channel region being located at a predetermined distance from signal lines on the layout.

10 Claims, 18 Drawing Sheets

U.S. PATENT DOCUMENTS

2003/0023935 A1* 1/2003 McManus et al. .............. 716/1
2004/0049754 A1* 3/2004 Liao et al. .................... 716/8

FOREIGN PATENT DOCUMENTS

| | | |
|---|---|---|
| JP | 10041393 | 2/1998 |
| JP | 10144794 | 5/1998 |
| JP | 10-284605 | 10/1998 |
| JP | 11330434 | 11/1999 |
| JP | 2002-299453 | 10/2002 |
| WO | WO 9928973 | 6/1999 |

* cited by examiner

■ CONTACT    ▦ CELL TERMINAL    ▨ P-DIFFUSED LAYER    ▢ CELL FRAME
▦ METAL-1 LAYER    ▧ N-DIFFUSED LAYER    ▦ POLY-SILICON    ⌐⌐ N-WELL

▦ METAL-1 LAYER    ▨ P-DIFFUSED LAYER    ▢ CELL FRAME
▧ N-DIFFUSED LAYER    ▦ POLY-SILICON    ⌐⌐ N-WELL (SUBSTITUTION TYPE-1)

METAL-7 SURFACE     METAL-8 SURFACE

FIG.12
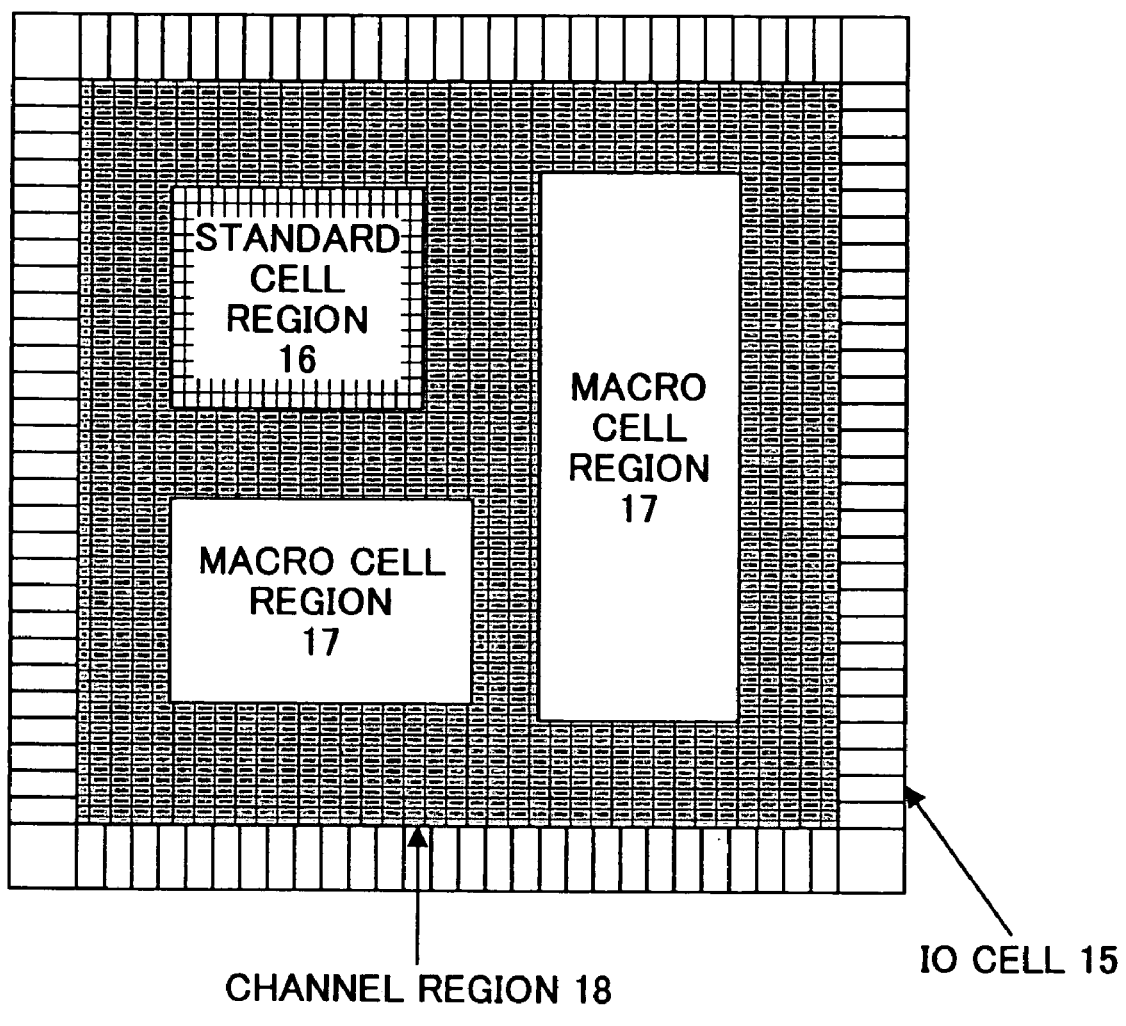
CHANNEL REGION 18
IO CELL 15
 FILLER-CELL REGION

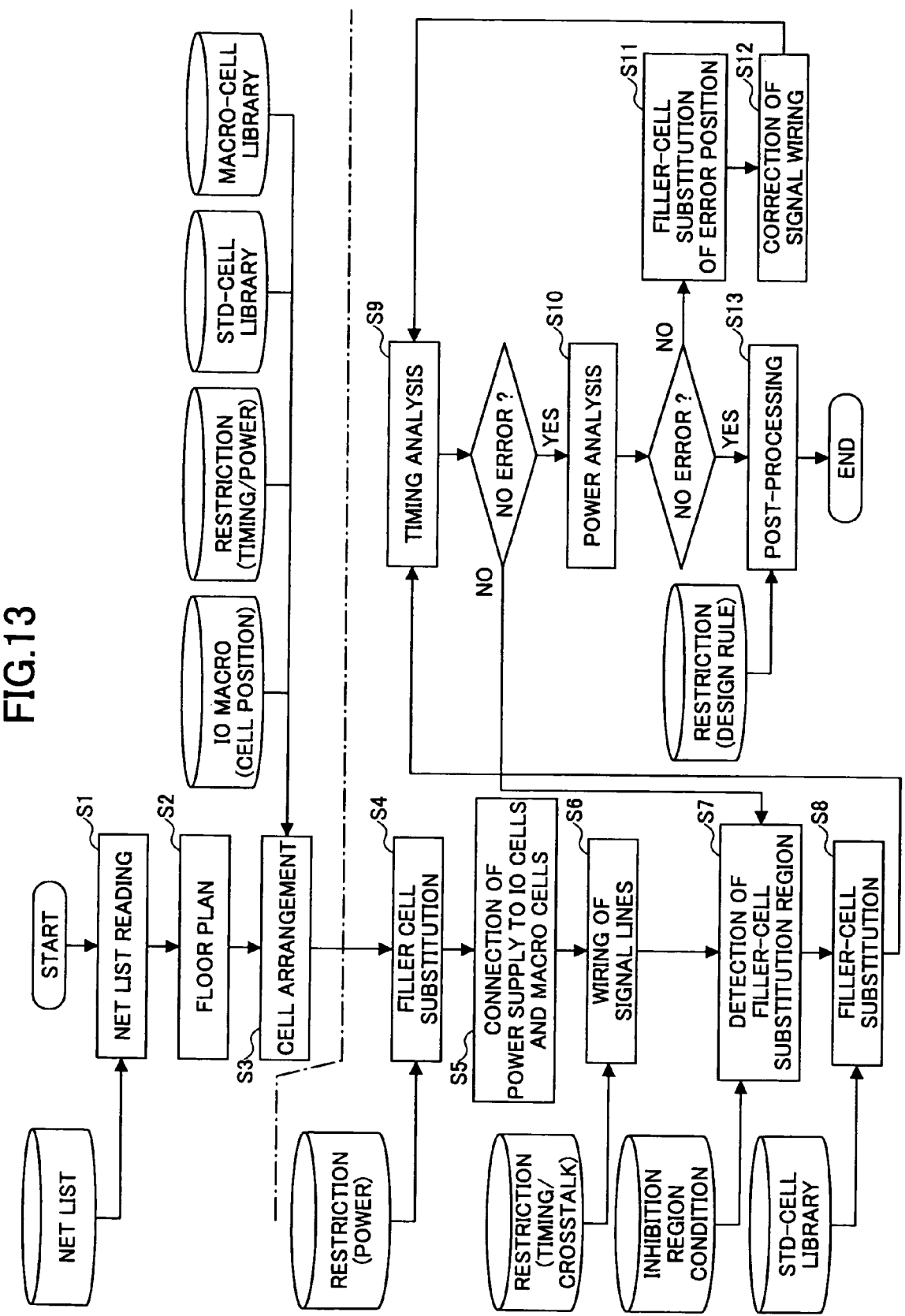

☐ FEEDDA
■ VIA 19
▯ SIGNAL LINE 20

⌐ ⌐ FILLER-CELL-SUBSTITUTION
└─┘ INHIBITION REGION 22

▨ FILLER-CELL SUBSTITUTION
   REGION 21

- ■ CONTACT
- ⊞ CELL TERMINAL
- ▧ P-DIFFUSED LAYER
- ⬚ CELL FRAME
- ▦ METAL-1 LAYER
- ▨ N-DIFFUSED LAYER
- ▒ POLY-SILICON
- ⬚ N-WELL

FIG.16
PATTERN-1
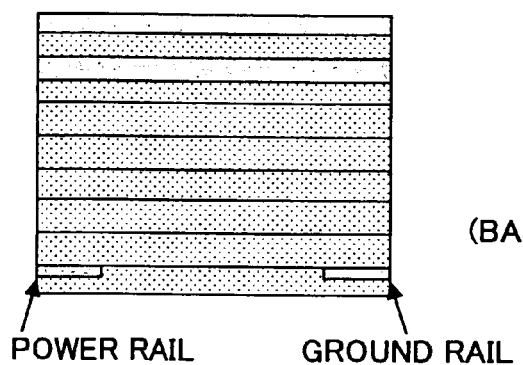
POWER RAIL    GROUND RAIL
PATTERN-2
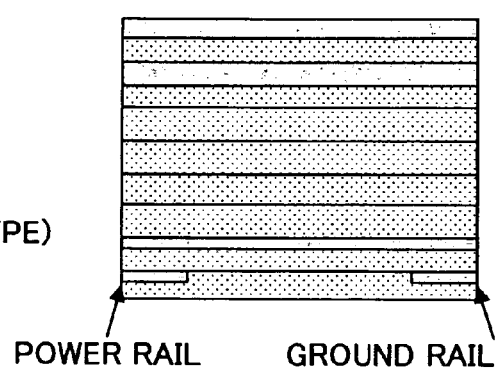
POWER RAIL    GROUND RAIL
(BASIC TYPE)
(SUBSTITUTION TYPE)

IO CELL 15 | PATTERN-2 REGION
CHANNEL REGION 18 | PATTERN-4 REGION

FIG.20

| | FILLER CELL PATTERNS | | | | | |
|---|---|---|---|---|---|---|
| | PATTERN-1 | PATTERN-2 | PATTERN-3 | PATTERN-4 | PATTERN-5 | PATTERN-6 |
| METAL-8 | GROUND | GROUND | GROUND | GROUND | GROUND | GROUND |
| METAL-7 | POWER | POWER | POWER | POWER | POWER | POWER |
| METAL-6 | NONE | NONE | NONE | NONE | NONE | NONE |
| METAL-5 | NONE | NONE | NONE | NONE | NONE | NONE |
| METAL-4 | NONE | NONE | NONE | POWER | GROUND | POWER |
| METAL-3 | NONE | POWER | GROUND | GROUND | GROUND | NONE |
| METAL-2 | POWER | POWER | POWER | POWER | POWER | NONE |
| METAL-1 | PWR/GRD | PWR/GRD | PWR/GRD | PWR/GRD | PWR/GRD | PWR/GRD |

LAYOUT DESIGN METHOD FOR SEMICONDUCTOR INTEGRATED CIRCUIT, AND SEMICONDUCTOR INTEGRATED CIRCUIT

CROSS-REFERENCE TO RELATED APPLICATION

This application is a Rule 1.53(b) Continuation of U.S. Ser. No. 10/701,249, now U.S. Pat. No. 7,076,756, filed Nov. 4, 2003, the entire contents of which are incorporated by reference herein.

BACKGROUND

1. Technical Field

The present disclosure relates to a layout design method which creates a multi-layered semiconductor integrated circuit through a cell layout technique, and relates to a semiconductor integrated circuit which is created by the layout design method.

2. Description of the Related Art

In the layout design of semiconductor integrated circuits, a layout creation tool which is called the automatic placement/wiring tool is used. In the layout creation tool, the structure information of basic cells, such as inverters and NANDs, are registered in the database in advance, the structure information of a desired cell is read from the database and arranged in a predetermined region of a chip layout, so that a semiconductor integrated circuit which meets the given specifications is acquired.

FIG. 1 is a flowchart for explaining a conventional layout design method using the automatic placement/wiring tool. A description will be given of the conventional layout design method with reference to FIG. 1.

As shown in FIG. 1, the net list which describes the circuit information of a layout of a semiconductor integrated circuit to be created is read from the database at step S21. Next, a floor plan, such as creation of design size, is created at step S22.

The IO cells, the macro cells, and the standard cells are arranged at the desired locations on the floor plan (created at step S22) according to the cell information read from the macro-cell library, the standard-cell library, etc. at step S23.

After the step S23 is performed, the wiring of power supply lines which supply the source power to these cells is performed at step S24. At the step S24, the connection of the power supply lines with the macro cell and the standard cell is also performed.

After the wiring of the power supply lines is completed, the wiring of signal lines is performed at step S25.

After the wiring of the signal lines is completed, the post-processing, such as the removal of the DRC error, the data format conversion, etc. is performed at step S26. When the post-processing is completed, the semiconductor integrated circuit is created.

Moreover, the restrictions which are needed at each step can be inputted by the user each time. The structure information of the IO cells, the macro cells and the standard cells, used at the step S23, is beforehand prepared in the database as a layout library, and the automatic placement/wiring tool carries out the cell arrangement of the step S23 by making reference to the structure information stored in the layout library.

Next, a description will be given of several layout libraries used by the conventional layout design method.

FIG. 2 shows a standard cell pattern (the left diagram) used by the conventional layout design method, and its equivalent circuit (the right diagram).

As shown in the left diagram of FIG. 2, the transistor is arranged near the center of the cell, and the transistor is usually provided with a power rail (indicated by METAL-1 (VDD)) and a ground rail (indicated by METAL-1 (GND)) which are used as the power supply lines for supplying the power to the transistor. The power rail and the ground rail are arranged at the upper and lower portions of the center of the cell.

Usually, the power rail and the ground rail are formed by the metal (indicated by METAL-1) of the lowest layer (LAYER-1), in order to supply the source power to the diffusion layer of the transistor. The functional cell of FIG. 2 is the inverter as a typical example of the standard cell. However, there are different functional cells, such as NAND, NOR, etc., than the inverter, which may be provided as the standard cell pattern. These functional cells have the respective electrical properties which are different from each other. These cells are called collectively the standard cells, and the database which stores the structure information of these functional cells is called the standard-cell library.

On the other hand, the cells which have complicated functions, such as the memory, are called the macro cells, and the database which stores the structure information of the macro cells is called the macro-cell library. Moreover, the database which stores the structure information of the IO cells is called the IO cell library. The kinds of the cells stored in these libraries can be specified by the designer (or the user), and there is no special definition which specifies the composition of these libraries.

The standard cells and the macro cells described above have the predetermined functions (the functional cells). On the other hand, there are filler cells which have no predetermined function, like the transistor, but are provided with the power rail and the ground rail on the layer-1, similar to the standard cells. The structure information of the filler cells is also included in the standard-cell library.

FIG. 3 shows a filler cell used by the conventional layout design method.

The filler cells are provided for the purposes of preventing the violation of the design rule created between the standard cells, and of obtaining the substrate potential. In the conventional layout design method, the filler cells are arranged between the standard cells in the standard-cell region.

FIG. 4 shows a conventional chip layout of a semiconductor integrated circuit.

The layout of FIG. 4 corresponds to the layout when the cell arrangement of the step S23 in the flowchart of FIG. 1 is performed. As shown in FIG. 4, the IO cells are arranged on the peripheral portion of the chip layout. There is the standard-cell region in which the standard cells are arranged inside the IO cells. The macro cells may be arranged in the vacant region of the chip layout. Moreover, inside the IO cells, there are the channel regions in which the standard-cell region and the wiring of the signal lines and the power supply lines by which the macro cells are not arranged are connected.

FIG. 5A and FIG. 5B show the arrangement of the power supply lines to the chip layout of FIG. 4. FIG. 5B is an enlarged view of the portion of the layout indicated by the letter "A" in FIG. 5A.

As described previously, in the conventional layout design method, the filler cells are arranged between the standard cells in the standard-cell region as shown in FIG. 5B.

In recent years, the demands for high-speed semiconductor integrated circuits with advanced features are increasing.

With such demands, the microscopic process of the semiconductor integrated circuit manufacture tends to progress. Using improved techniques, the improvement in the performance of the semiconductor integrated circuit has been proposed by the manufacturers. A description will now be given of some improved techniques of conventional layout design methods.

In order to optimize the power supply efficiency, the area in which the circuit element is not formed is used as a power line wiring region. For example, Japanese Laid-Open Patent Application No. 9-199601 discloses a semiconductor integrated circuit having such structure.

The standard cell has the problem in that it requires the external region where the power supply line and the standard cell are mutually connected. In order to eliminate the problem, the standard cell is provided with an internal region for connecting the power supply line to the standard cell perpendicularly with the power supply line. For example, Japanese Laid-Open Patent Application No. 10-41393 discloses a standard cell having such structure.

There is the problem that common dimensions of respective macro cells must be used in order to form the power supply lines and grounding lines at the upper and lower edge portions. To resolve the problem, the portion acting as the via hall which provides electrical connection with the power supply metal, is provided in each of the respective standard cells. For example, Japanese Laid-Open Patent Application No. 10-144794 discloses a semiconductor integrated circuit having such structure of standard cells.

In order to eliminate the influences of the wiring of signal lines, the top of the standard cells is shielded with the upper-layer metal layer. For example, Japanese Laid-Open Patent Application No. 11-330434 discloses a semiconductor device having such structure of the upper-layer metal shielding.

In order to increase the capability of current supply in the semiconductor integrated circuit, the second metal layer is provided as the power rail of standard cells. For example, Japanese Laid-Open Patent Application No. 2001-506429 discloses such arrangement of power supply lines.

As the microscopic process of the semiconductor integrated circuit manufacture progresses, some problems arise and it is demanded to take into consideration the circuit design stage. A description will be given of some problems which arise with the development of the microscopic process of the semiconductor integrated circuit manufacture.

1. Wiring Cost

The multilevel metallization progresses with the development of the microscopic process of the semiconductor integrated circuit manufacture. FIG. 6A and FIG. 6B show the microscopic structure of a segment of the chip layout of FIG. 5A. FIG. 6A is a plan view of the microscopic structure of the segment, and FIG. 6B is a cross-sectional view of the microscopic structure of the segment taken along the line A-A' indicated in FIG. 6A.

In the conventional design technique, the wiring of signal lines is performed after the wiring of power supply lines is performed on the chip layout. As shown in FIG. 6B, the metal-1 of the layer-1 and the metal-8 of the layer-8 in the power supply wiring are connected together by means of the vertically extending vias. If this is done, the metals of the intermediate layers of the layer-2 to the layer-7 are not used for the wiring of signal lines. The disadvantage of wiring cost and the redundant wiring will take place.

2. Power Supply Noise/Voltage Drop

The integration level of the transistors progresses with the development of the microscopic process of the semiconductor integrated circuit manufacture, which results in the problem of power supply noise due to the charging and discharging current at the time of simultaneous switching of the transistors. Moreover, in the microscopic process, the voltage drop (IR-DROP) in which the voltage supplied to the transistor becomes excessively low arises.

The voltage drop is greatly dependent on the resistance of power supply wiring, and the power supply width gives significant influence on the chip size. The optimization of the power supply wiring is one of the important issues in the semiconductor integrated circuit design. However, in the current circumstances, it is difficult to analyze the complicated structure of the power supply wiring, and it is difficult to set up the optimal power supply width.

3. Planarization and Occupancy Rate

In the semiconductor integrated circuit manufacture, the planarization processing is performed by CMP (chemical and mechanical polishing). Especially, in the interlayer dielectric process of copper and low dielectric material, the problem, such as dishing, becomes remarkable as shown in FIG. 7. FIG. 7 shows the cross-section of the chip layer when the interlayer dielectric process of copper and low dielectric material is performed.

To eliminate the problem, it is necessary to take measures of creating dummy metal or the like so as to provide the mask pattern with uniform planarization, because there are many elements resulting from the occupancy rate of metal.

4. Complication of Power Supply Structure

The multilevel metallization progresses increasingly, and the configuration of the power supply structure where the advantage of the multilevel metallization is used efficiently makes it possible that the wiring of power supply lines does not cause the power supply noise and voltage drop, etc. However, because of the complicated structure of the power supply wiring, it is difficult for the conventional technique to realize it, or the man-hour needed to realize it is significantly increased.

5. Microscopic Process

In the microscopic process of the semiconductor integrated circuit manufacture, the manufacture processes of the conventional technique become complicated, and large-scale processing is required. It takes great time to carry out the semiconductor integrated circuit manufacture.

SUMMARY

In an aspect of the present disclosure, a layout design method is provided which realizes the multilevel metallization with high integration level efficiently and easily by using a simply technique.

In another aspect of the present disclosure, a semiconductor integrated circuit which is created by a layout design method described herein so that the multilevel metallization with high integration level is realized efficiently and easily.

In another aspect of the present disclosure, a layout design method for a semiconductor integrated circuit is provided which comprises the steps of: providing a cell layout library which stores structure information of functional cells and a plurality of groups of filler cells, each filler cell acting to fill space between the functional cells, one of the plurality of groups of filler cells containing an upper-layer metal and a lower-layer metal wherein the lower-layer metal has a power rail and a ground rail which are not connected to the upper-layer metal, and another of the plurality of groups of filler cells containing an upper-layer metal and a lower-layer metal wherein the lower-layer metal has a power rail and a ground rail one of which is connected to the upper-layer metal through a via; arranging the functional cells on a layout based on the structural information from the layout library; and arranging the filler cells of any of the plurality of groups selectively based on the structural information from the layout library so that the filler cells are arranged in channel regions where the functional cells are not located on the layout, each channel region being located at a predetermined distance from signal lines on the layout.

In another aspect of the present disclosure, a semiconductor integrated circuit is created by a layout design method using a cell layout library which store structure information of functional cells and a plurality of groups of filler cells, each filler cell acting to fill space between the functional cells, one of the plurality of groups of filler cells containing an upper-layer metal and a lower-layer metal wherein the lower-layer metal has a power rail and a ground rail which are not connected to the upper-layer metal, and another of the plurality of groups of filler cells containing an upper-layer metal and a lower-layer metal wherein the lower-layer metal has a power rail and a ground rail one of which is connected to the upper-layer metal through a via, the semiconductor integrated circuit comprising: the functional cells arranged on a layout based on the structural information from the layout library; signal lines arranged on the layout; and the filler cells of any of the plurality of groups selectively arranged based on the structural information from the layout library so that the filler cells are arranged in channel regions where the functional cells are not located on i he layout, each channel region being located at a predetermined distance from the signal lines un the layout.

In the above-mentioned layout design method, the power supply wiring is not completely performed on the chip layout before the wiring of signal lines is performed, and the connection of the power supply wiring of the upper-layer metal and the power supply wiring of the lower layer metal is performed after the wiring of signal lines. Such layout design method hardly affects the cost of the signal wiring and can perform efficient power supply wiring. Therefore, reduction of wiring cost can be achieved.

Another advantage is reduction of power supply noise and voltage drop. It is possible to reduce the influences of the power supply noise and voltage drop by using the upper-layer metal efficiently or arranging the bypass capacitor. The power supply noise reduction is also achieved by the capacity between the metal layers by arranging the power supply wiring in the power supply lines and the ground lines alternately.

Another advantage is the improvement of the planarization and occupancy rate. The uniform formation of metal in the layer of the filler cells can eliminate the problem of the planarization and occupancy rate which arises with the VDSM (very deep submicron) in the recent technique. Moreover, the configuration which meets the design rule is achieved with the configuration state of the filler cells.

Another advantage is the countermeasure against complicated power supply structure. The power supply wiring is performed by using the filler cells, and it is possible to realize complicated power supply wiring structure. There is no great increase in the man-hour needed, and efficient power supply wiring process can be realized because the arrangement of the filler cells can be incorporated in the conventional layout design method.

Moreover, the power supply wiring is carried out with the composition which sandwiches the signal lines between the upper and lower layers, the signal wiring can be shielded by the wiring of power supply lines having stable potential, and the cross talk of the signal wiring can be reduced.

BRIEF DESCRIPTION OF THE DRAWINGS

Other features and advantages the subject matter of the present disclosure will be apparent from the following detailed description when read in conjunction with the accompanying drawings.

FIG. 12 is a diagram showing a chip layout of a semiconductor integrated circuit of one preferred embodiment of the invention.

FIG. 13 is a flowchart for explaining the layout design method of one preferred embodiment of the invention.

FIG. 16 is a diagram showing examples of different patterns of the filler cells according to the invention.

FIG. 20 is a diagram for explaining a number of filler cell patterns used by one preferred embodiment of the layout design method of the invention.

DETAILED DESCRIPTION OF PREFERRED EMBODIMENTS

A description will now be provided of examples and exemplary embodiments of this disclosure with reference to the accompanying drawings.

Figure 8A:
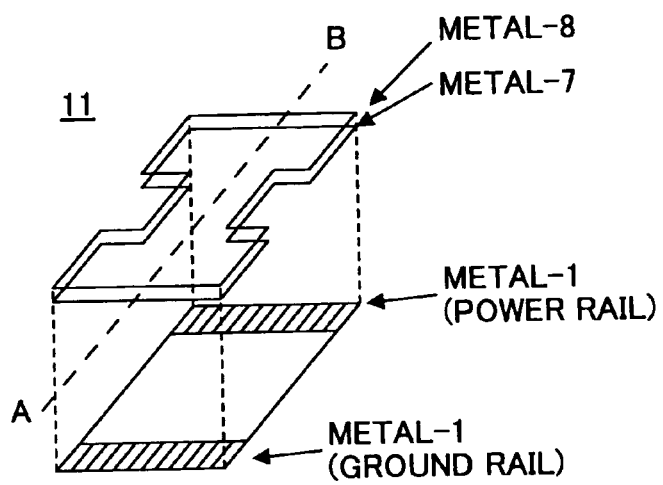
FIG. 8A and FIG. 8B are diagrams for explaining the arrangement of a basic type filler cell used by the layout design method according to the invention.
Figure 8B:
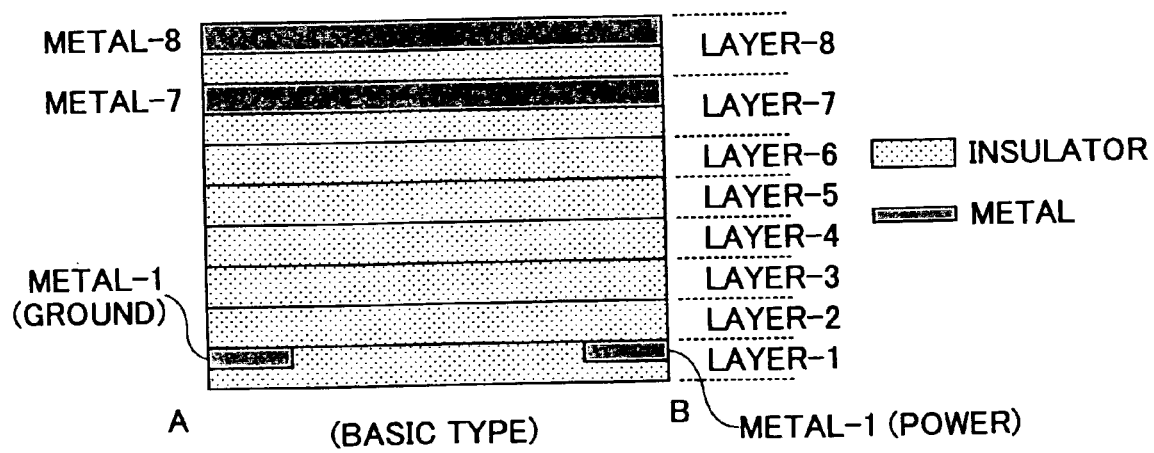
Figure 9A:
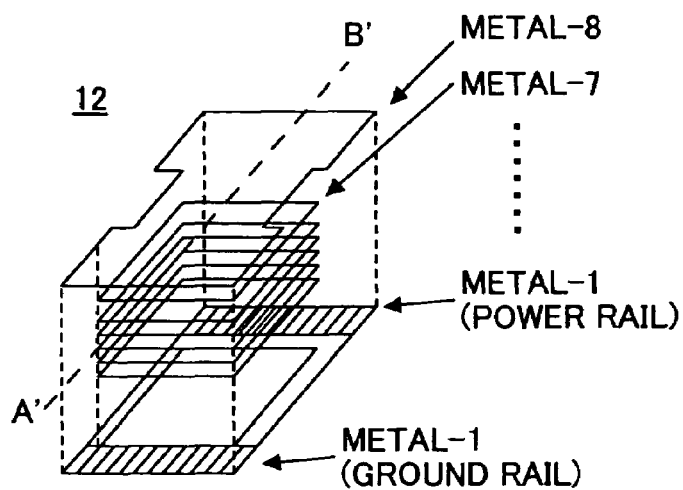
FIG. 9A and FIG. 9B are diagrams for explaining the arrangement of a substitution type filler cell used by the layout design method according to the invention.
Figure 9B:
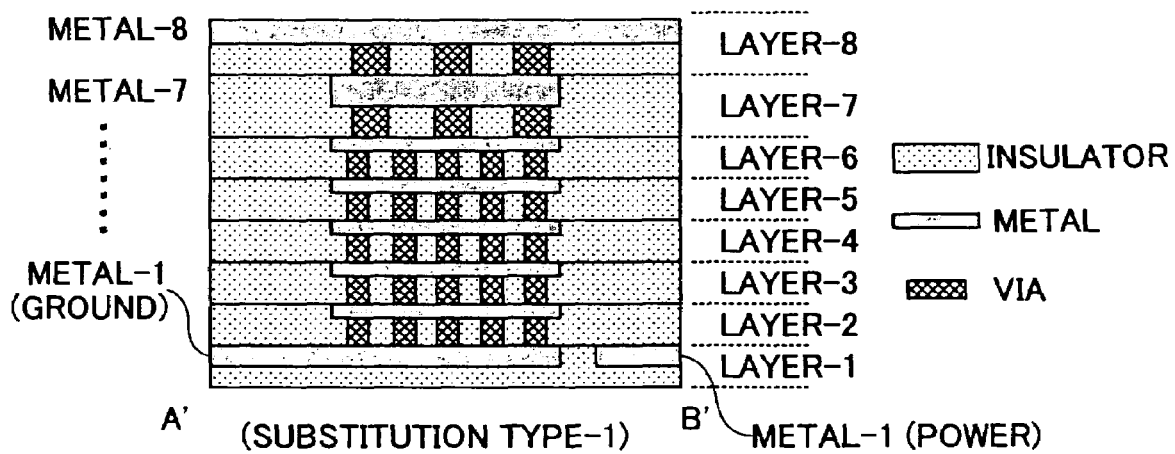
Figure 10A:
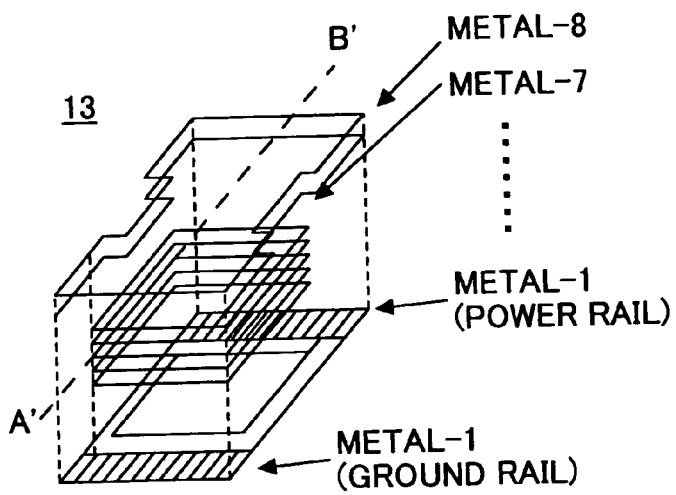
FIG. 10A and FIG. 10B are diagrams for explaining the arrangement of a substitution type filler cell used by the layout design method according to the invention.
Figure 10B:
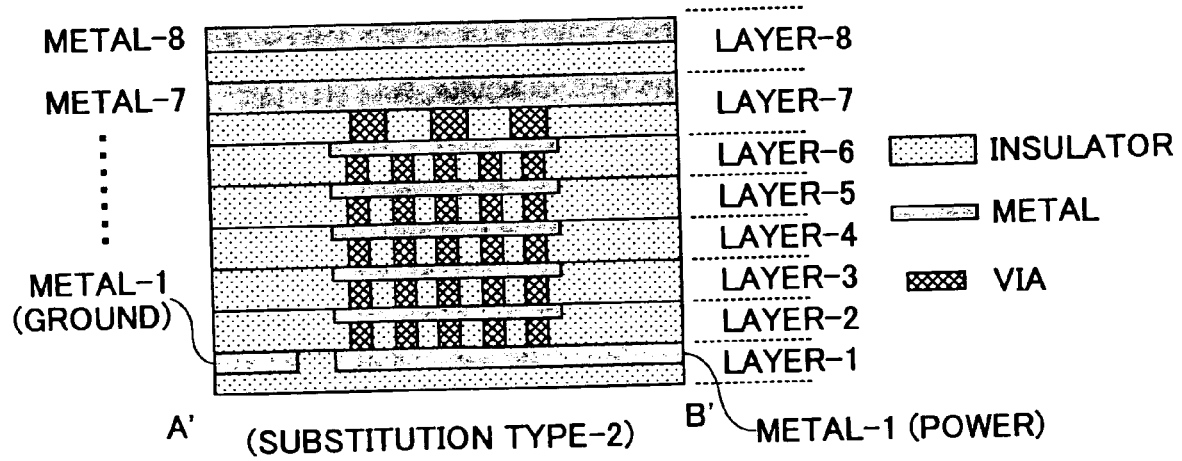

First, a description will be given of typical examples of filler cells which are used by the layout design method according to the present invention. FIG. 8A and FIG. 8B shows the arrangement of a basic type filler cell 11 used by the layout design method according to the invention. FIG. 9A and FIG. 9B show the arrangement of a substitution type filler cell 12 used by the layout design method according to the invention. FIG. 10A and FIG. 10B show the arrangement of a substitution type filler cell 13 used by the layout design method according to the invention.

For the sake of convenience of description, the multi-layered semiconductor integrated circuit of one preferred embodiment of the invention is formed into the eight-layer structure. However, the present invention is not limited to this embodiment.

Figure 3:
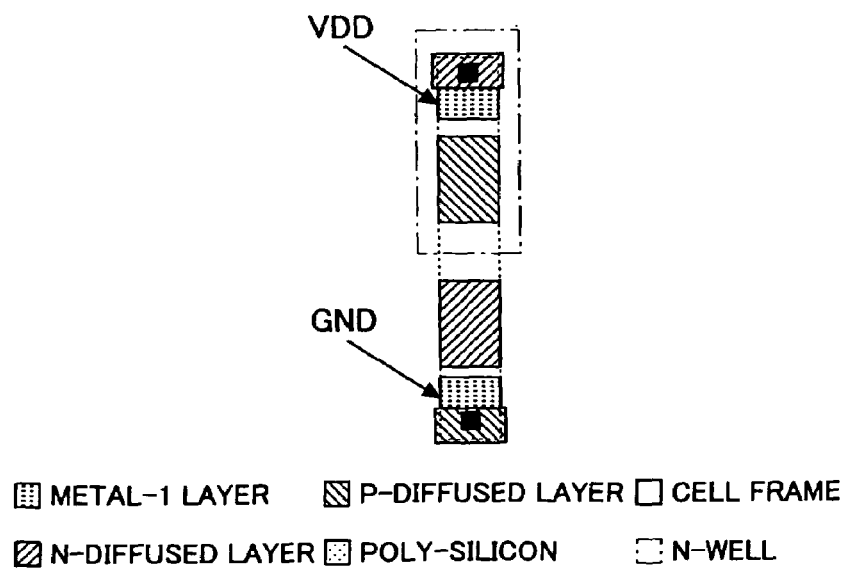
FIG. 3 is a diagram showing a filler cell used by the conventional layout design method.
Figure 4:
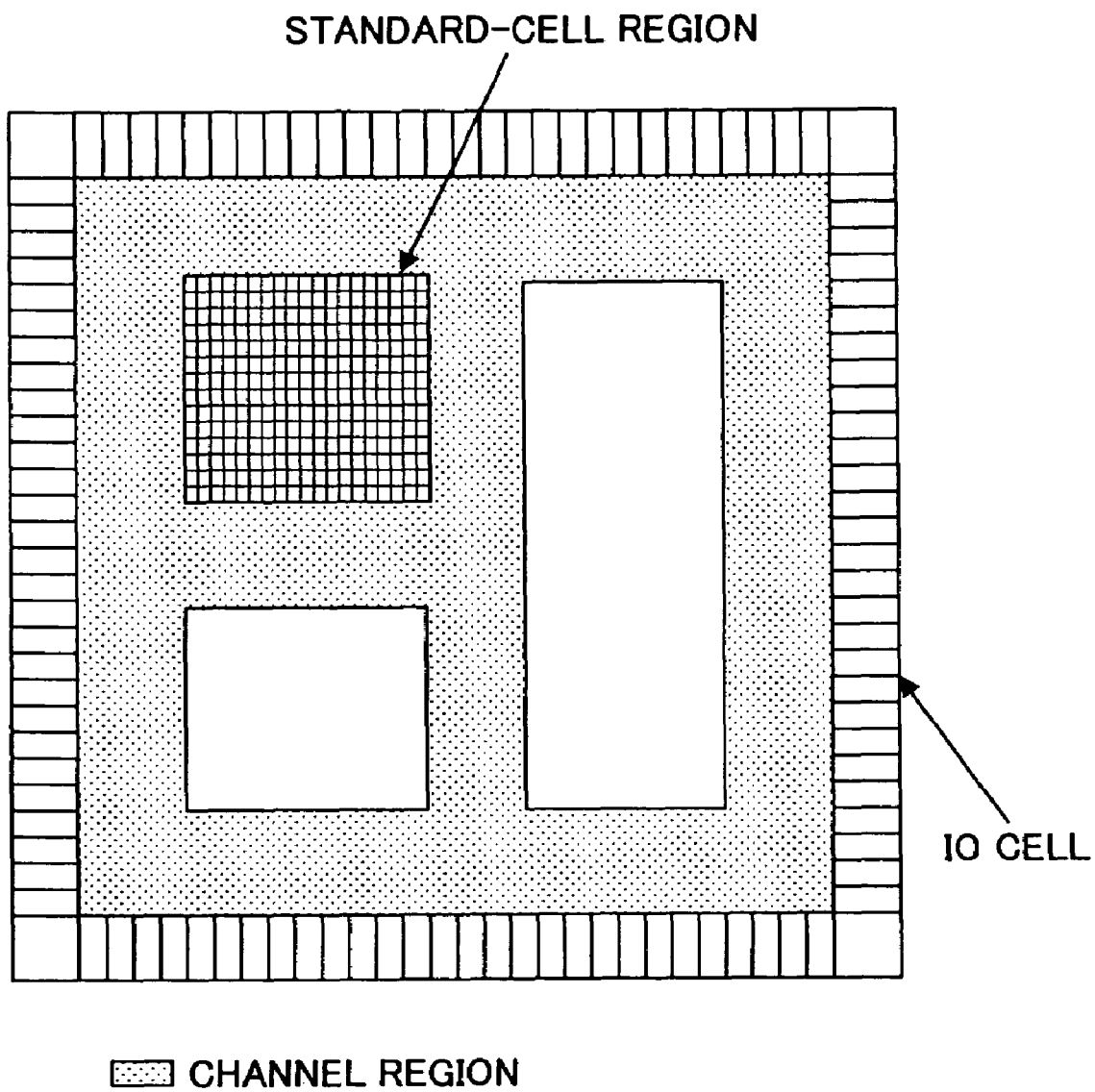
FIG. 4 is a diagram showing a conventional chip layout of a semiconductor integrated circuit.
Figure 5A:
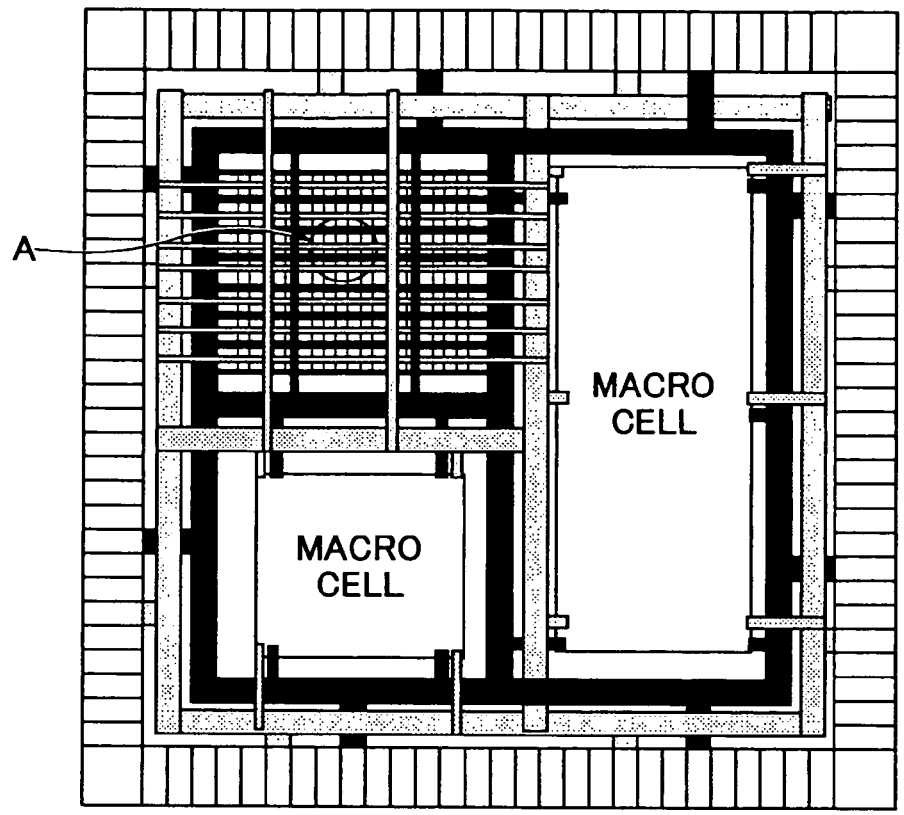
FIG. 5A and FIG. 5B are diagrams showing the arrangement of power supply lines to the chip layout of FIG. 4.
Figure 5B:
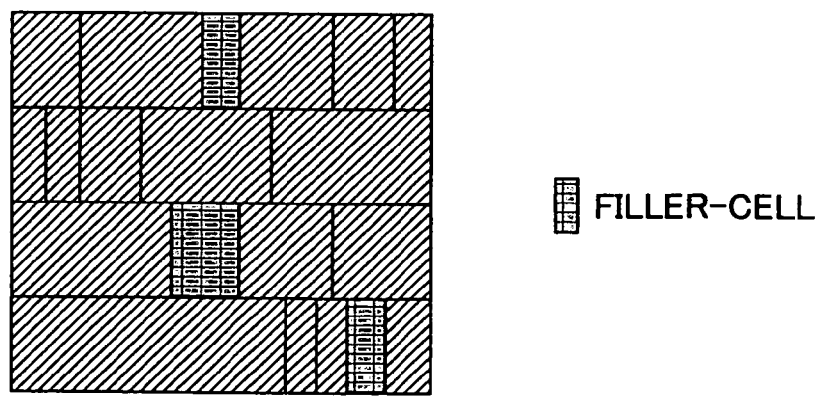
Figure 6A:
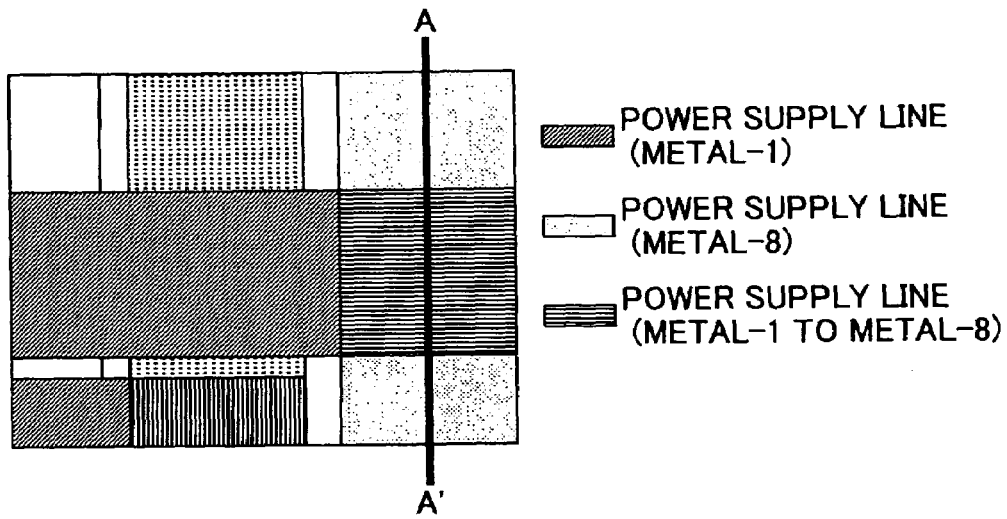
FIG. 6A and FIG. 6B are diagrams showing the microscopic structure of a segment of the chip layout of FIG. 5A.
Figure 6B:
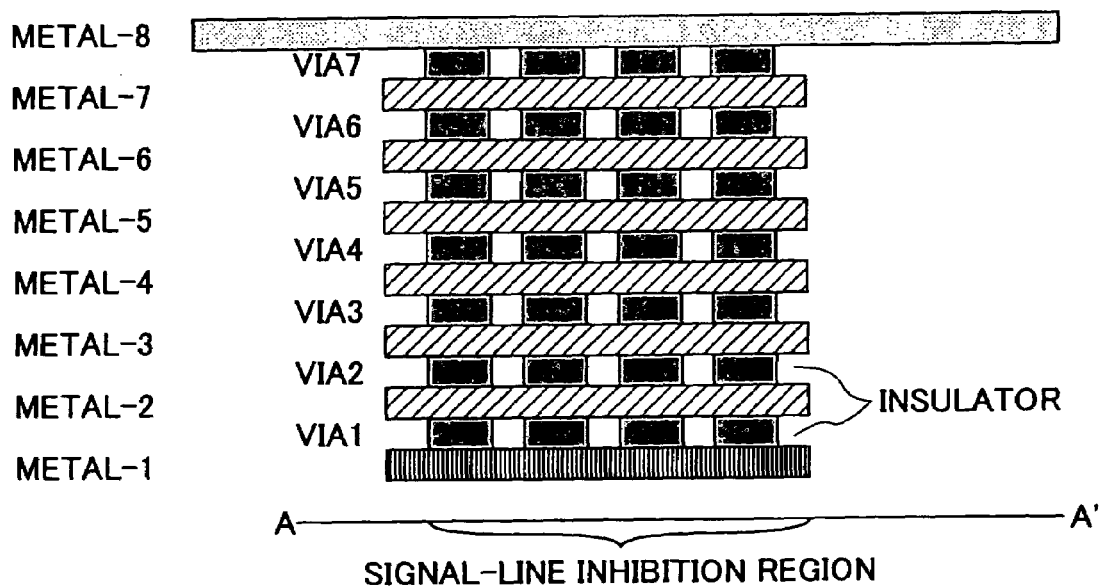
Figure 7:
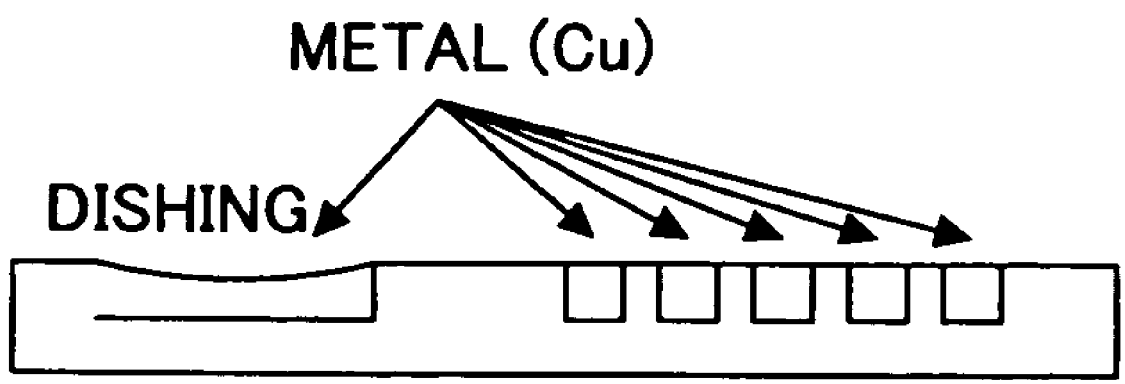
FIG. 7 is a cross-sectional view of the chip layer when the interlayer dielectric process for copper and low dielectric material is performed.

The basic type filler cell 11 of FIG. 8A includes the metal-1, the metal-7, the metal-8, and the insulator layers of the layer-1 through the layer-8, and the metal-1 of the layer-1 of FIG. 8A is essentially the same as that of the filler cell of FIG. 3. FIG. 8B is a cross-sectional view of the filler cell II taken along the line A-B indicated in FIG. 8A.

As shown in FIG. 8A, the metal-1 is provided with a power rail and a ground rail. As shown in FIG. 8B, the metal-7 of the layer-7 and the metal-8 of the layer-8 are formed over the power rail and the ground rail of the metal-1. The metal-7 and the metal-8 are not connected to the power rail or the ground rail of the metal-1. No metal layer is formed in the intermediate layers of the layer-2 through the layer-6.

The substitution type 1 filler cell 12 of FIG. 9A is provided with the metal-1, the metal-7, and the metal-8, which is similar to the basic type filler cell of FIG. 8A. However, the metal-8 of the filler cell 12 is connected to the ground rail of the metal-1 by means of the vertically extending vias. FIG. 9B is a cross-sectional view of the filler cell 12 taken along the line A'-B' indicated in FIG. 9A. As shown in FIG. 9B, the metal layer is formed in each of the intermediate layers of the layer-2 through the layer-6, and these metal layers are connected together by means of the vias.

The substitution type 2 filler cell 13 of FIG. 10A is provided with the metal-1, the metal-7, and the metal-8, which is similar to the basic type filler cell of FIG. 8A. However, the metal-7 of the filler cell 13 is connected to the power rail of the metal-1 by means of the vertically extending vias. The metal-8 of the filler cell 13 is not connected to the power rail or the ground rail of the metal-1, which is similar to that of the basic type filler cell 11 of FIG. 8A. FIG. 10B is a cross-sectional view of the filler cell 13 taken along the line A'-B' indicated in FIG. 10A. As shown in FIG. 10B, the metal layer is formed in each of the intermediate layers of the layer-2 through the layer-6, and these metal layers are connected together by means of the vias.

In each of the filler cells 11 through 13 of FIG. 8A through FIG. 10A, the metal-7 of the layer-7 and the metal-8 of the layer-8 formed into the I-shaped pattern. The substitution type 1 filler cell 12 of FIG. 9A is provided for connection with the ground line wiring (the ground rail), and the substitution type 2 filler cell 13 of FIG. 10A is provided for connection with the power supply line wiring (the power rail).

Figure 11:
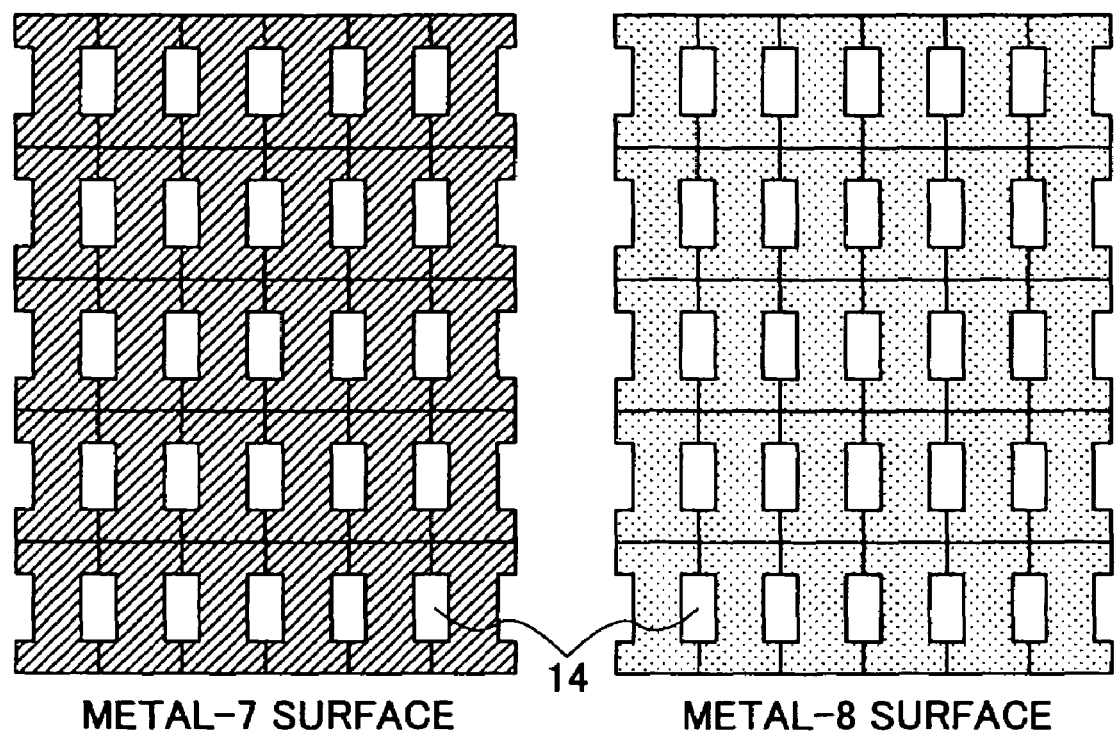
FIG. 11 is a diagram showing the metal-7 surface and the metal-8 surface when a plurality of the basic type filler cells are arranged.

FIG. 11 shows the metal-7 surface and the metal-8 surface when a plurality of the basic type filler cells 11 are arranged. As shown in FIG. 11, the metal-7 surface and the metal-8 surface are entirely covered by the I-shaped patterns of the metal-7 and the metal-8 of FIG. 8A, respectively. In the present embodiment, the metal lacking rectangular sections 14 are left in the metal surfaces because the I-shaped patterns are arranged. The rectangular sections 14 are provided for the adjustment of the occupancy rate which is performed so that the design rule specified by the semiconductor integrated circuit manufacture processes for the planarization may be satisfied.

It is desirable that there are no restrictions in the manufacture processes. However, when the adjustment of the occupancy rate is needed, the occupancy rate of the upper-layer metal formed on the filler cells can be easily modified with the rectangular sections 14 so as to satisfy the design rule.

Alternatively, if the standard cell region of the chip layout is provided also with the metal-7 and the metal-8, in addition to the basic type filler cells, the same configuration may be used.

FIG. 12 shows a chip layout of a semiconductor integrated circuit of one preferred embodiment of the invention.

In the layout of FIG. 12, the basic type filler cells 11 as in FIG. 8A are arranged in the channel regions 18 which are located inside the IO cells 15, and outside the standard cell region 16 and the macro cell region 17.

In the present embodiment, the upper wiring of the metal-7 surface and the metal-8 surface as shown in FIG. 11 is uniformly arranged in the channel regions 18.

However, when the metal-7 surface and the metal-8 surface are just formed as shown in FIG. 12, the metal-8 and the metal-7 are not yet connected to the power rail or the ground rail of the metal-1. The substitution of the substitution type filler cells 12 or 13 (FIG. 9A or FIG. 10A) for the basic type filler cells 11 (FIG. 8A) mentioned above is performed later, and the connection of the upper-layer metal and the lower-layer metal is established by the substitution at that time.

FIG. 13 shows the layout design method of one preferred embodiment of the invention.

Figure 1:
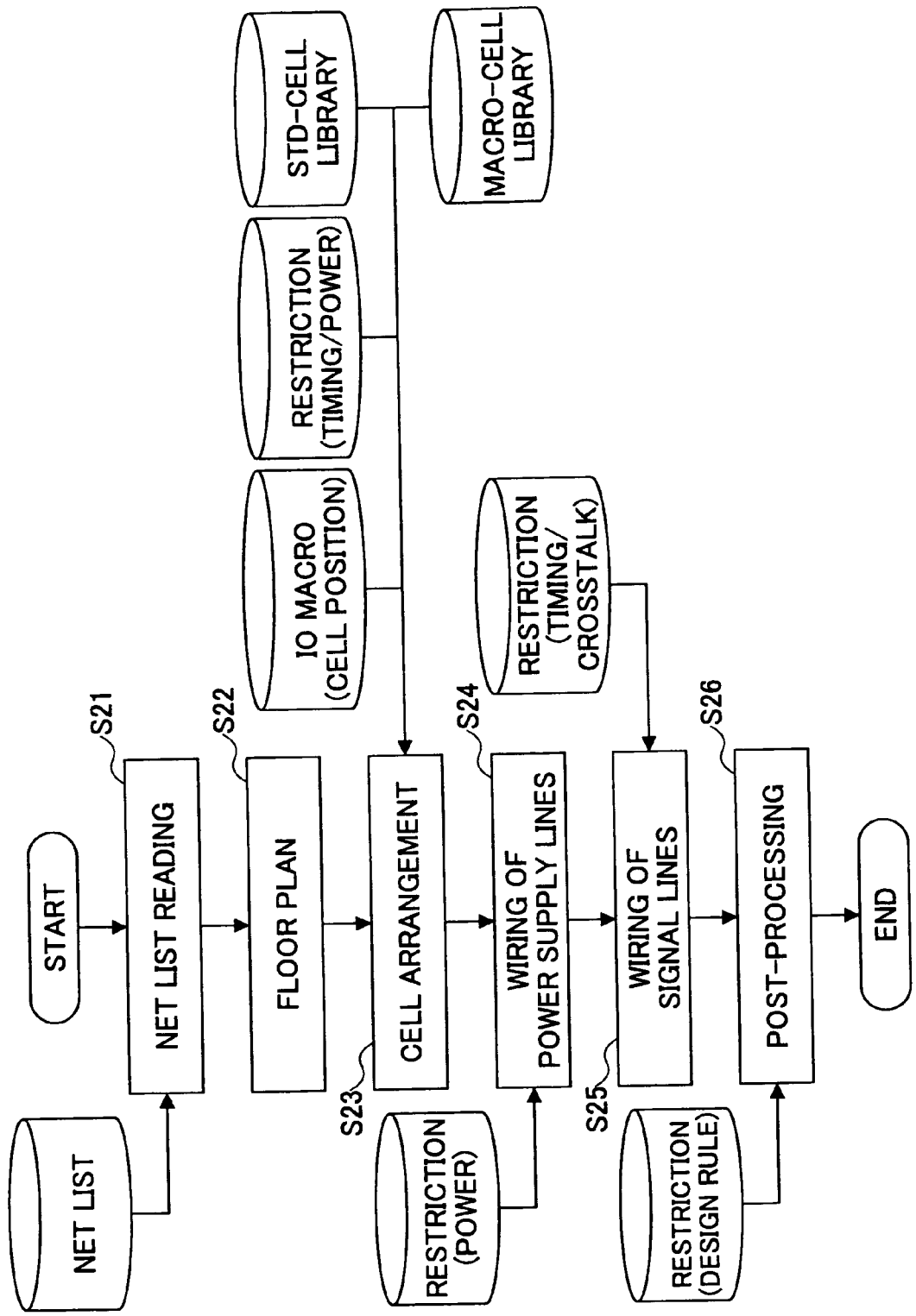
FIG. 1 is a flowchart for explaining a conventional layout design method.
Figure 2:
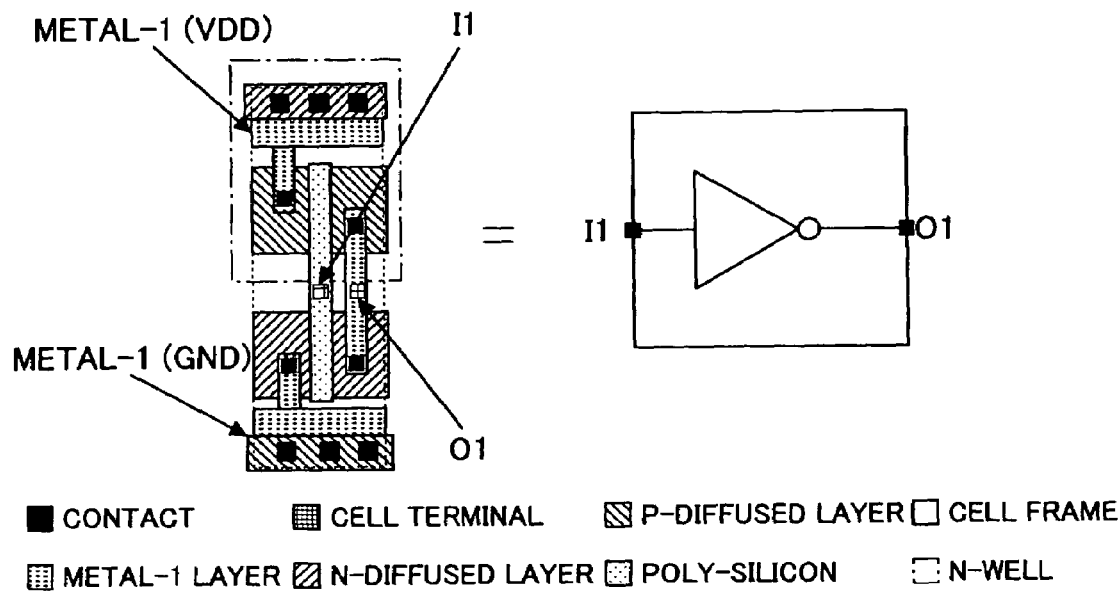
FIG. 2 is a diagram showing a standard cell pattern used by the conventional layout design method and its equivalent circuit.

In the layout design method of FIG. 13, the steps S1-S3 are essentially the same as the steps S21-S23 of the conventional layout design method of FIG. 1, and a description thereof will be omitted.

After the cell arrangement of step S3 is performed, the basic type filler cells are arranged at step S4 in the channel regions 18 of the chip layout other than the IO cells 15, the macro-cell region 17 and the standard-cell region 16 where the macro cells and the standard cells have been arranged at the step S3. The region where the basic type filler cells are arranged is determined by the designer (the user). It is not necessary that the filler cells are arranged in all the vacant regions of the chip layout.

When the arrangement of the filler cells at the step S4 is completed, the structure of the upper-layer metal is configured as shown in FIG. 11, which has been described previously.

At step S5, the power supply pins of the IO cells and the power supply pins of the macro cells are connected to the power supply lines or wiring of the basic type filler cells so that the macro cells and the IO cells are connected to the filler cells.

The filler cells have the height that is the same as the height of the standard cells, and the wiring of the power supply lines of the filler cells arranged around the periphery of the standard-cell region is automatically connected to the power supply pins of the standard cells.

At step S6, the wiring of signal lines is performed in the same manner as in the conventional layout design method (the step S25).

At step S7, the filler cell substitution regions at an arbitrarily predetermined distance (the specific distance value can be specified by the user) from the signal lines arranged at the step S6 are detected.

Figure 14A:
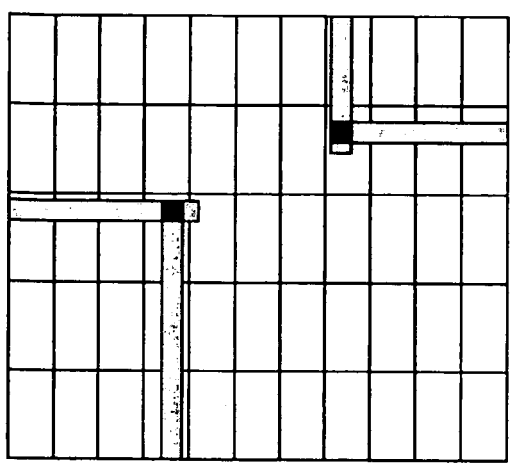
FIG. 14A and FIG. 14B are diagrams showing a channel region of the chip layout including the signal lines, and the filler-cell substitution regions in the channel region.
Figure 14B:
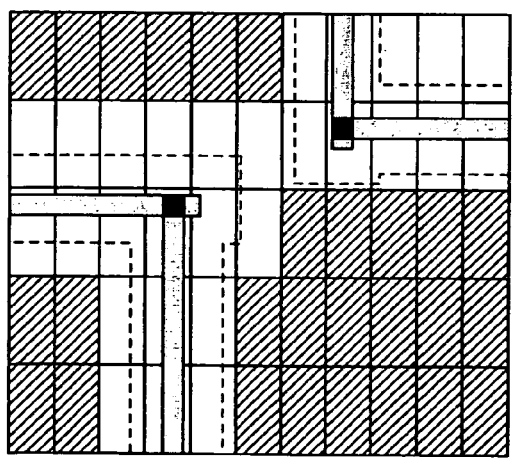

FIG. 14A and FIG. 14B show a channel region 18 of the chip layout including the signal lines 20 and the filler cell substitution regions 21. As shown in FIG. 14A, the signal lines 20 formed on the different layers in the channel region 18 are connected together by means of the vias 19. As shown in FIG. 14B, the region which is located beyond the predetermined distance from the signal lines 20 is detected as being the filler cell substitution region 21 (indicated by the shading lines), and the region which is located within the predetermined distance from the signal lines 20 is detected as being the filler cell substitution inhibition region 22 (indicated in white).

More specifically, an arbitrary distance value Xum is specified by the user, the filler-cell regions located within the specified distance (the value of which is indicated by Xum) from the signal lines 20 are excluded from the filler-cell substitution regions 21, and the filler cell regions located beyond the specified distance from the signal lines 20 are detected as being the filler-cell substitution regions 21.

At step S8, the substitution of the substitution type filler cells of FIG. 9A and FIG. 10A for the basic type filler cells is performed in the filler-cell substitution regions detected at the step S7. At this time, the substitution ratio of the step S8 may be specified by the designer. Specifically, when importance is attached to the supply power lines for the target chip layout, the number of the substitution type 2 filler cells as in FIG. 10A in which the metal-7 of the layer-7 is connected to the power rail of the metal-1 by means of the vertically extending vias is increased. On the other hand, when importance is attached to the ground lines for the target chip layout, the number of the substitution type 1 filler cells as in FIG. 9A in which the metal-8 of the layer-8 is connected to the ground rail of the metal-1 by means of the vertically extending vias is increased. It is good for metal 1 (ground rail) to increase the rate of the filler cell of the substitution type 1 of FIG. 9 connected to metal 8. It is advisable that the filler cells of the same type are not located intensively and dispersed moderately, when importance is attached to the power supply lines and the ground lines equally concerning the arrangement locations.

When the substitution of the filler cells at the step S8 is completed, the timing analysis (which determines whether each device operates at proper timing as being designed) is performed at step S9, in order to check the influences of the substitution of the filler cells on the chip.

When there is any error as the result of the step S9, the control is transferred to the step S7 and the filler-cell substitution inhibition region condition of the step S7 is changed. Then, the substitution of the filler cells at the step S8 is performed again, and the timing analysis at the step S9 is performed again.

When there is no error as the result of the timing analysis at the step S9, the power analysis (which determines whether the voltage drop (IR-DROP) at each point falls within the specified range) is performed at step S10.

When there is any error as the result of the step S10, the substitution of the filler cell at the defective position is performed at step S11. When the filler cell is arranged in the filler cell substitution inhibition region at this time and shooting with the signal line or violation of DRC arises, the correction of the signal wiring is performed at step S12.

When the correction of the signal wiring at the step S12 is completed, the control is transferred to the timing analysis of the step S9. When there is no error as the results of the timing analysis and power analysis at the steps S9 and S10, the post-processing, such as the removal of the DRC error, the data format conversion, etc. is performed at step S13, which is similar to the conventional layout design method (the step S26). When the post-processing is completed, the semiconductor integrated circuit is created.

Figure 15:
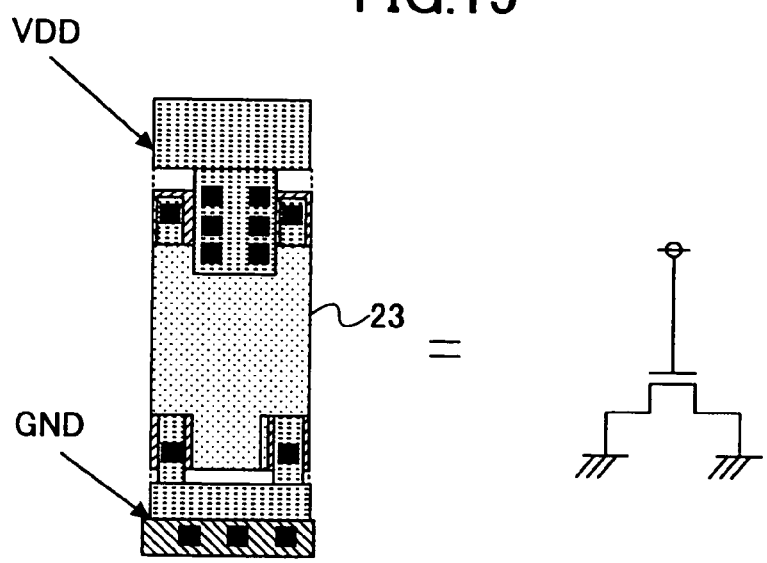
FIG. 15 is a diagram showing a bypass capacitor arranged for the filler cell according to the invention, and its equivalent circuit.

FIG. 15 shows a bypass capacitor 23 (the left diagram) arranged for each of the filler cells of FIG. 8A, FIG. 9A and FIG. 10A, and its equivalent circuit (the right diagram).

The oxide film under the polysilicon gate is the dielectric material (the insulator), the bypass capacitor 23 is formed between the gate and the diffusion layer as shown in FIG. 15.

The bypass capacitor 23 can be arranged for each of the filler cells of any type (the basic type, the substitution type 1 or the substitution type 2) according to the present invention.

It is desirable that the cell layout library is provided with both a first layout pattern including the filler cells with the bypass capacitor arranged for each of the filler cells, and a second layout pattern including the filler cells with no bypass capacitor. If the shape of the bypass capacitor is the same, the first layout pattern and the second layout pattern differs only in the subsequent process after the formation of the metal layer 1, and the man-hour needed for the semiconductor integrated circuit manufacture can be reduced remarkably.

For example, the manufacturing process is started with the second layout pattern including the filler cells with no bypass capacitor, and subsequently the layout design can be created by performing the substitution of the filler cells with the bypass capacitor for the filler cells with no bypass capacitor. It is not necessary that the manufacturing process is interrupted.

FIG. 20 shows a number of filler cell patterns used by one preferred embodiment of the layout design method of the invention.

FIG. 16 shows examples of different patterns (pattern 1 and pattern 2) of the filler cells shown in FIG. 20. The filler cells of FIG. 8A, FIG. 9A, and FIG. 10A correspond to the pattern 1, and the pattern 2 is provided with two metal layers connected to the power supply wiring.

When the metal-2 layer of the filler cell of the pattern 2 is arranged, the filler cell of concern and the adjacent filler cell are connected together by means of the metal-2 layer.

The arrangement of the cross-section of the filler cells of the pattern 3 through the pattern 6 shown in FIG. 20 is essentially the same as those shown in FIG. 16, and a description thereof will be omitted.

The selection and arrangement of these filler cells can be freely carried out on the wiring layers. Moreover, the configuration of the wiring is not specified by the design rule, it is desirable that the filler cell of concern and the adjacent filler cell are connected together at the arrangement location. Alternatively, the wiring space may be provided purposely, and it is possible to provide the signal wiring track (the path along which the signal lines pass).

The wiring of power supply lines can be carried out with the composition which sandwiches the signal lines between the upper and lower layers or between the right and left regions, depending on the formation of the pattern. Thus, the signal wiring can be shielded by the wiring of power supply lines having stable potential, and the crosstalk of the signal wiring can be reduced. For example, if the filler cells of the pattern 6 are used, the metal-4 acts to perform that function.

Moreover, the capacitance between the metal layers contributes to the reduction of the power supply noise by using the pattern in which the power supply wiring is arranged in the power supply lines and the ground lines alternately. If the metal layer which is not used as the signal wiring is mainly used for the power supply wiring, efficient power supply structure can be realized according to the wiring layer.

Figure 17:
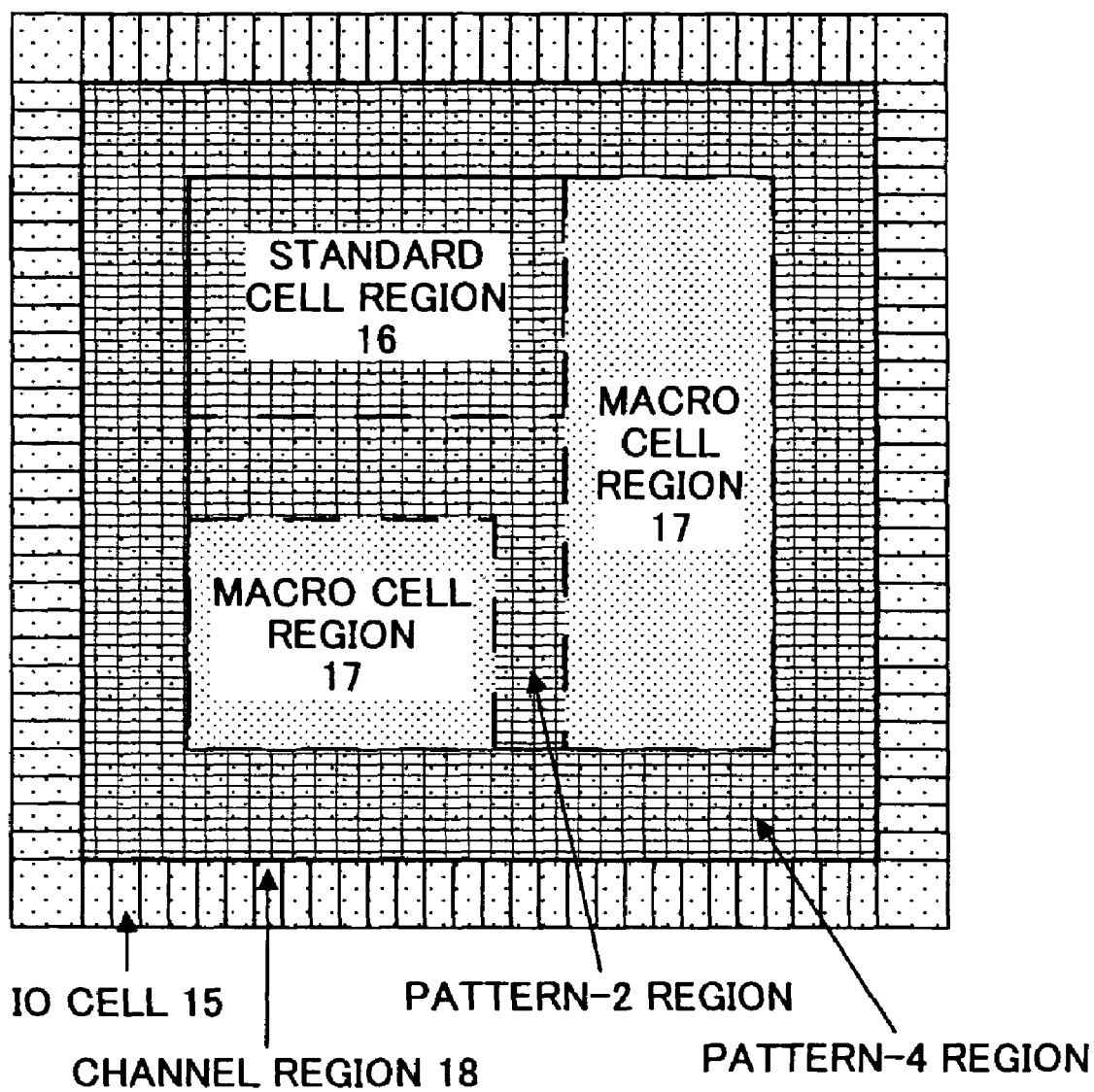
FIG. 17 is a diagram showing the arrangement of different patterns of the filler cells according to the invention.

FIG. 17 shows the arrangement of different patterns (pattern 2 and pattern 4) of the filler cells shown in FIG. 20.

For example, when the metal-3 and metal-4 layers are used to arrange the signal wiring in the channel regions 18 between the macro-cell region 17 and the standard-cell region 16 and/or between the macro-cell regions 17, the filler cells of the pattern 2 of FIG. 20 are used as the pattern-2 region shown in FIG. 17.

On the other hand, when the metal-5 and metal-6 layers are used to arrange the signal wiring in the channel regions 18 between the IO cells 15 and the macro-cell region 17 and/or between the IO cells 15 and the standard-cell region 16, the filler cells of the pattern 4 of FIG. 20 are used as the pattern-4 region shown in FIG. 17.

Figure 18:
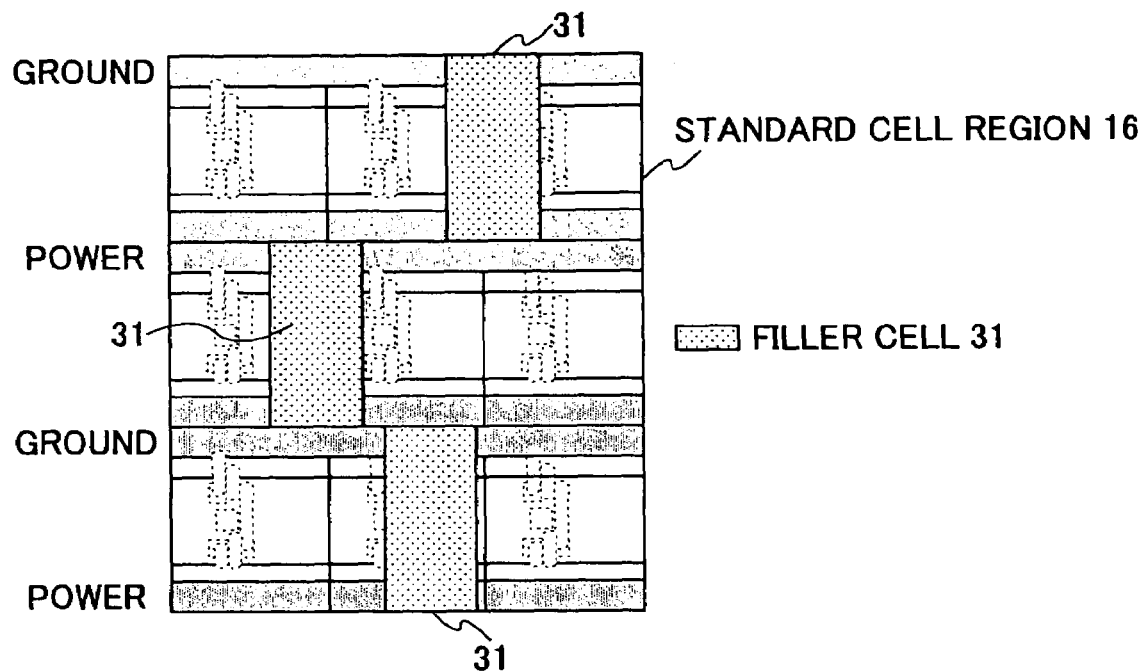
FIG. 18 is a diagram showing the arrangement of filler cells over the standard cell region according to the invention.
Figure 19:
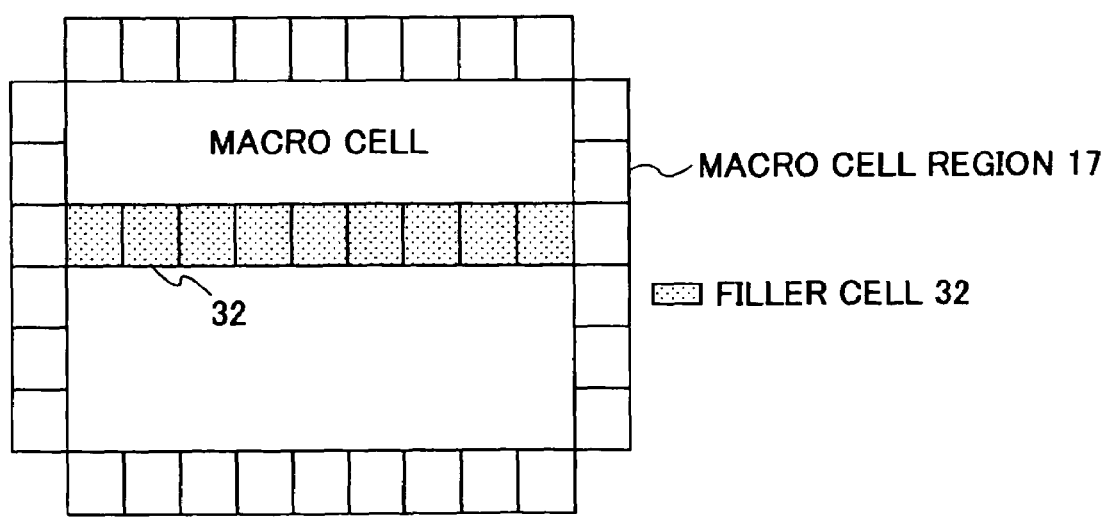
FIG. 19 is a diagram showing the arrangement of filler cells over the macro cell region according to the invention.

FIG. 18 shows the arrangement of filler cells over the standard cell region according to the invention. FIG. 19 shows the arrangement of filler cells over the macro cell region according to the invention.

The standard cells have the lower-layer metal which is the same as the lower-layer metal of the filler cells 31 of the invention. As shown in FIG. 18, the duplicate arrangement of the filler cells 31 over the standard cell region 16 can be performed because the upper-layer metal and lower layer metal can be easily connected.

Moreover, it is possible to carry out the duplicate arrangement of the filler cells 32 of the invention over the macro-cell region 17 as shown in FIG. 19, because the macro cells are arranged by taking the power supply structure of the duplicate arrangement into consideration.

According to the layout design method of the invention, the following advantages are acquired.

One of the advantages is the reduction of wiring cost. In the layout design using the filler cell according to the invention, the power supply wiring is not completely performed on the chip layout before the wiring of signal lines is performed, and the connection of the power supply wiring of the upper-layer metal and the power supply wiring of the lower layer metal is performed after the wiring of signal lines. The layout design method of the invention hardly affects the cost of the signal wiring and can perform efficient power supply wiring.

Another advantage is the reduction of power supply noise and voltage drop. It is possible to reduce the influences of the power supply noise and voltage drop by using the upper-layer metal efficiently or arranging the bypass capacitor. The power supply noise reduction is also achieved by the capacity between the metal layers by arranging the power supply wiring in the power supply lines and the ground lines alternately.

Another advantage is the improvement of the planarization and occupancy rate. The uniform formation of metal in the layer of the filler cells can eliminate the problem of the planarization and occupancy rate which arises with the VDSM (very deep submicron) in the recent technique. Moreover, the configuration which meets the design rule is achieved with the configuration state of the filler cells.

Another advantage is countermeasure against complicated power supply structure. The power supply wiring is performed by using the filler cells, and it is possible to realize complicated power supply wiring structure. There is no great increase in the man-hour needed, and efficient power supply wiring process can be realized because the arrangement of the filler cells can be incorporated in the conventional layout design method.

Moreover, the power supply wiring is carried out with the composition which sandwiches the signal lines between the upper and lower layers, the signal wiring can be shielded by the wiring of power supply lines having stable potential, and the cross talk of the signal wiring can be reduced.

According to the layout design method of the invention, it is possible to form the power supply wiring of the multi-layered metal structure efficiently by arranging at least one type of the filler cells in the channel region around the periphery of the standard-cell region or the macro cell region.

According to the layout design method of the invention, it is possible to prevent the influences of the power supply noise and voltage drop by forming the bypass capacitor in the filler cell itself selectively and using the upper-layer metal.

According to the layout design method of the invention, with at least two types of filler cells, the layers up to the arbitrary layer are mutually made into the same form and the mask form below the arbitrary layer is decided even if the type of the filler cells to be arranged is undecided, the manufacturing process can be started. For example, in the manufacturing process, certain time is taken until the manufacture of the lower layer below the metal layers is completed, and the substitution work of the substitution type filler cell is performed during that time, and it is possible to shorten the man-hour necessary for completion of the semiconductor integrated circuit manufacture.

According to the layout design method of the invention, in the region used as the candidate for the configuration, efficient power supply structure can be realized according to the wiring layer by configuring selectively the filler cells which mainly used the metal layer which is not used as signal wiring in the region for power supply wiring.

According to the layout design method of the invention, the power supply wiring can be locally reinforced by carrying out the duplicate arrangement of the filler cells over the standard cell region or the macro cell region. Moreover, the duplicate arrangement can be carried out on the cells, and flexibility of the filler cell configuration can be increased.

The present invention is not limited to the above-described embodiments, and variations and modifications may be made without departing from the scope of the present invention.

Further, this disclosure is based on Japanese priority application No. 2002-320912, filed on Nov. 5, 2002, the entire contents of which are incorporated herein by reference.

What is claimed is:

1. A layout design method for a semiconductor integrated circuit, comprising the steps of:

providing a cell layout library which stores structure information of functional cells and a plurality of groups of filler cells, each filler cell acting to fill space between the functional cells, at least one of the plurality of groups of filler cells containing an upper-layer metal and a lower-layer metal having a first portion which is not connected to the upper-layer metal, the lower-layer metal having a second portion which is connected to the upper-layer metal through a via;

arranging the functional cells on a layout based on the structural information from the layout library; and arranging the filler cells of any of the plurality of groups selectively based on the structural information from the layout library so that the filler cells are arranged in channel regions where the functional cells are not located on the layout, each channel region being located at a predetermined distance from signal lines on the layout.

2. The layout design method of claim 1, wherein the filler cells of at least one of the plurality of groups are arranged in the channel regions where standard cells and macro cells are not located on the layout, and power supply lines are arranged on the layout so that the filler cells of said at least one group are connected to the power supply lines.

3. The layout design method of claim 1, wherein the filler cells of at least one of the plurality of groups which contain a bypass capacitor are arranged on the layout.

4. The layout design method of claim 1, wherein the filler cells of at least two of the plurality of groups have a common configuration with respect to intermediate layers between an uppermost layer and a lowermost layer of the layout.

5. The layout design method of claim 1, wherein the filler cells are selectively arranged in the channel regions on the layout so that metal layers of the filler cells which are not connected to the signal lines are connected to power supply lines on the layout.

6. The layout design method of claim 1, wherein a duplicate arrangement of the filler cells of at least one of the plurality of groups is provided over a standard-cell region or a macro-cell region of the layout.

7. The layout design method of claim 1, wherein the filler cells are arranged in the channel regions after wiring of signal lines is performed.

8. The layout design method of claim 1, wherein the arrangement of the filler cells in the channel regions connects power supply wiring of the upper layer metal and power supply wiring of the lower-layer metal.

9. The layout design method or claim 8, wherein the arrangement of the filler cells in the channel regions connects said upper layer metal to one of said power rail and said ground rail of said lower-layer metal.

10. A semiconductor integrated circuit device manufacturing method comprising the steps:

providing a cell layout library which stoves structure information of functional cells and a plurality of groups of filler cells, each filler cell acting to fill space between the functional cells, at least one of the plurality of groups of filler cells containing an upper-layer metal and a lower-layer metal having a first portion which is not connected to the upper-layer metal, the lower-layer metal having a second portion which is connected to the upper-layer metal through a via;

arranging the functional cells on a layout based on the structural information from the layout library; and arranging the filler cells of any of the plurality of groups selectively based on the structural information from the layout library so that the filler cells are arranged in channel regions where the functional cells are not located on the layout, each channel region being located at a predetermined distance from signal lines on the layout.

* * * * *